United States Patent
Cunning et al.

(10) Patent No.: US 8,272,626 B2
(45) Date of Patent: Sep. 25, 2012

(54) BUBBLER FOR THE TRANSPORTATION OF SUBSTANCES BY A CARRIER GAS

(75) Inventors: Hugh Cunning, Chester (GB); Graham Williams, South Wirral (GB); Rajesh Odedra, Altrincham (GB); Ravi Kanjolia, North Andover, MA (US)

(73) Assignee: Sigma-Aldrich Co. LLC, St. Louis, MO (US)

( * ) Notice: Subject to any disclaimer, the term of this patent is extended or adjusted under 35 U.S.C. 154(b) by 1081 days.

(21) Appl. No.: 12/093,893

(22) PCT Filed: Oct. 12, 2006

(86) PCT No.: PCT/GB2006/003801
§ 371 (c)(1),
(2), (4) Date: Jun. 24, 2008

(87) PCT Pub. No.: WO2007/057631
PCT Pub. Date: May 24, 2007

(65) Prior Publication Data
US 2008/0251016 A1    Oct. 16, 2008

(30) Foreign Application Priority Data
Nov. 17, 2005  (GB) .................................. 0523429.9

(51) Int. Cl.
*C23C 16/00* (2006.01)
(52) U.S. Cl. .................................................... 261/122.1
(58) Field of Classification Search ............... 261/122.1; 118/722, 726
See application file for complete search history.

(56) References Cited

U.S. PATENT DOCUMENTS

| | | | |
|---|---|---|---|
| 1,372,328 A | 3/1921 | Adams | |
| 1,541,853 A | 6/1925 | Rottmann | |
| 2,738,762 A | 3/1956 | Pawlyk | 118/49 |
| 3,230,245 A | 1/1966 | Binning et al. | 260/462 |
| 3,338,761 A | 8/1967 | Cheney et al. | 148/175 |
| 3,360,168 A | 12/1967 | Bret | 222/335 |
| 3,589,335 A | 6/1971 | Harthman et al. | 118/405 |
| 3,628,339 A | 12/1971 | Porter | 62/5 |
| 3,756,068 A | 9/1973 | Villarroel et al. | 73/23 |
| 3,831,069 A | 8/1974 | Merrell et al. | 317/246 |
| 3,884,819 A | 5/1975 | Schultz et al. | 250/533 |

(Continued)

FOREIGN PATENT DOCUMENTS
CN   1668899 A   9/2005
(Continued)

OTHER PUBLICATIONS

Translation of JP 2003-273093 A, Sep. 26, 2003, Toyama et al.*
(Continued)

*Primary Examiner* — Duane Smith
*Assistant Examiner* — Christopher P Jones
(74) *Attorney, Agent, or Firm* — Harness, Dickey & Pierce, P.L.C.

(57) ABSTRACT

A bubbler (2) for delivering liquid or solid metalorganic compounds to a reactor site. The bubbler has an inner and outer chamber and has a member (14) positioned between its inlet (6) and outlet (8) that is provided with a plurality of apertures therein. The member (14) is preferably in the form of a perforated disc having a predefined density of apertures therein to provide optimum pick up and flow of carrier gas through the bubbler.

35 Claims, 12 Drawing Sheets

U.S. PATENT DOCUMENTS

| | | | | |
|---|---|---|---|---|
| 3,935,740 | A | 2/1976 | Whitney | 73/304 C |
| 4,010,650 | A | 3/1977 | Piatkowski, Jr. | 73/304 C |
| 4,099,939 | A | 7/1978 | Vancheri et al. | 55/246 |
| 4,140,735 | A | 2/1979 | Schumacher | 261/22 |
| 4,191,541 | A | 3/1980 | Jenkins | 55/18 |
| 4,211,748 | A | 7/1980 | Vincent | 422/90 |
| 4,224,828 | A | 9/1980 | Steinke | 73/421.5 R |
| 4,285,701 | A | 8/1981 | Schlenker | 55/17 |
| 4,293,009 | A | 10/1981 | Fulton | 141/311 |
| 4,298,037 | A | 11/1981 | Schumacher et al. | 141/1 |
| 4,325,911 | A | 4/1982 | Vincent | 422/75 |
| 4,448,072 | A | 5/1984 | Tward | 73/304 C |
| 4,449,405 | A | 5/1984 | Franz et al. | 73/304 C |
| 4,645,524 | A | 2/1987 | Bocko et al. | 65/18.1 |
| 4,704,988 | A | 11/1987 | Mellet | 118/726 |
| 4,809,129 | A | 2/1989 | Hansen, III et al. | 361/284 |
| 4,859,375 | A | 8/1989 | Lipisko et al. | 261/20 |
| 4,883,362 | A | 11/1989 | Gärtner et al. | 366/101 |
| 4,886,178 | A | 12/1989 | Graf | 215/247 |
| 4,915,880 | A | 4/1990 | Jenkins | 261/124 |
| 4,919,304 | A | 4/1990 | Markowicz | 222/3 |
| 4,947,790 | A | 8/1990 | Gärtner et al. | 118/726 |
| 4,966,207 | A | 10/1990 | Howard et al. | 141/98 |
| 5,019,423 | A | 5/1991 | Hiai et al. | 427/248.1 |
| 5,031,068 | A | 7/1991 | Hansen, III et al. | 361/284 |
| 5,078,922 | A | 1/1992 | Collins et al. | 261/139 |
| 5,199,603 | A | 4/1993 | Prescott | 222/3 |
| 5,217,904 | A | 6/1993 | Bruno | 436/181 |
| 5,262,130 | A | 11/1993 | Kissel et al. | 422/311 |
| 5,336,473 | A | 8/1994 | Nadler et al. | 422/193 |
| 5,553,395 | A | 9/1996 | Wen et al. | 34/359 |
| 5,582,647 | A | 12/1996 | Kato et al. | 118/715 |
| 5,603,169 | A | 2/1997 | Kim | 34/587 |
| 5,607,581 | A | 3/1997 | Gerner et al. | 210/198.2 |
| 5,653,813 | A | 8/1997 | Benzing et al. | 118/726 |
| 5,701,084 | A | 12/1997 | Borthwick, Jr. et al. | 324/690 |
| 5,755,885 | A | 5/1998 | Mikoshiba et al. | 118/715 |
| 5,773,621 | A | 6/1998 | Nisino et al. | 55/244 |
| 5,835,678 | A | 11/1998 | Li et al. | 392/401 |
| 5,961,360 | A | 10/1999 | Nishimura et al. | 445/24 |
| 5,992,830 | A | 11/1999 | Daubs et al. | 261/121.1 |
| 6,008,421 | A | 12/1999 | Larsen et al. | 570/255 |
| 6,029,717 | A | 2/2000 | Siegele et al. | 141/198 |
| 6,032,724 | A | 3/2000 | Hatta | 135/80.2 |
| 6,045,125 | A | 4/2000 | Daubs et al. | 261/74 |
| 6,077,356 | A | 6/2000 | Bouchard | 118/715 |
| 6,078,729 | A | 6/2000 | Kopel | 392/402 |
| 6,148,681 | A | 11/2000 | Gravel et al. | 73/866.5 |
| 6,203,851 | B1 | 3/2001 | Walter | 427/248.1 |
| 6,257,446 | B1 | 7/2001 | Pike | 222/52 |
| 6,270,839 | B1 | 8/2001 | Onoe et al. | 427/248.1 |
| 6,341,615 | B1 | 1/2002 | Zorich et al. | 137/14 |
| 6,401,463 | B1 | 6/2002 | Dukhan et al. | 62/5 |
| 6,444,038 | B1 | 9/2002 | Rangarajan et al. | 118/726 |
| 6,475,291 | B1 | 11/2002 | Petvai et al. | 134/3 |
| 6,599,484 | B1 | 7/2003 | Zigler et al. | 422/130 |
| 6,607,785 | B2 | 8/2003 | Timmons et al. | 427/248.1 |
| 6,698,728 | B1 | 3/2004 | Ravetz et al. | 261/121.1 |
| 6,718,126 | B2 | 4/2004 | Lei | 392/388 |
| 6,874,770 | B2 | 4/2005 | Torkaman | 261/130 |
| 6,905,541 | B2 | 6/2005 | Chen et al. | 117/86 |
| 6,921,062 | B2 | 7/2005 | Gregg et al. | 261/23.1 |
| 6,962,654 | B2 | 11/2005 | Jürgensen et al. | 117/99 |
| 6,978,984 | B2 | 12/2005 | Kang et al. | 261/135 |
| 6,986,814 | B2 | 1/2006 | Wheat et al. | 118/726 |
| 7,077,388 | B2 | 7/2006 | Stamp et al. | 261/121.1 |
| 7,100,441 | B2 | 9/2006 | Williams et al. | 73/304 C |
| 7,156,380 | B2 | 1/2007 | Soininen | 261/122.1 |
| 7,186,385 | B2 | 3/2007 | Ganguli et al. | 422/129 |
| 7,261,118 | B2 | 8/2007 | Birtcher et al. | 137/13 |
| 7,278,438 | B2 | 10/2007 | Scholz | 137/14 |
| 7,282,119 | B2 | 10/2007 | Odedra et al. | 203/10 |
| 7,300,038 | B2 | 11/2007 | Gregg et al. | 261/23.1 |
| 7,364,897 | B2 | 4/2008 | Heaney et al. | 435/287.2 |
| 7,370,848 | B2 | 5/2008 | Stamp et al. | 261/121.1 |
| 7,423,750 | B2 | 9/2008 | Hoshizaki et al. | 356/317 |
| 7,429,361 | B2 | 9/2008 | Ganguli et al. | 427/248.1 |
| 7,429,403 | B2 | 9/2008 | Wheat et al. | 427/250 |
| 7,458,222 | B2 | 12/2008 | Orr | 62/5 |
| 7,464,917 | B2 | 12/2008 | Lee et al. | 261/121.1 |
| 7,487,956 | B2 | 2/2009 | Gregg et al. | 261/142 |
| 7,497,420 | B2 | 3/2009 | Soininen | 261/104 |
| 7,556,244 | B2 | 7/2009 | Gregg et al. | 261/23.1 |
| 7,569,191 | B2 | 8/2009 | Ganguli et al. | 427/255.394 |
| 7,601,225 | B2 | 10/2009 | Tuominen et al. | 118/726 |
| 7,722,720 | B2 | 5/2010 | Shenai-Khatkhate et al. | 118/726 |
| 7,828,274 | B2 | 11/2010 | Gregg et al. | 261/142 |
| 7,829,032 | B2 | 11/2010 | van Dam et al. | 422/159 |
| 2002/0078894 | A1* | 6/2002 | Timmons et al. | 118/726 |
| 2003/0116019 | A1 | 6/2003 | Torkaman | |
| 2004/0062865 | A1 | 4/2004 | Wheat et al. | 427/248.1 |
| 2005/0008799 | A1 | 1/2005 | Tomiyasu et al. | 428/34.1 |
| 2005/0227358 | A1 | 10/2005 | McEntee et al. | 436/164 |
| 2006/0037540 | A1 | 2/2006 | Woelk et al. | 427/248.1 |
| 2006/0213446 | A1 | 9/2006 | Atlas et al. | 118/715 |
| 2007/0221127 | A1 | 9/2007 | Tran et al. | 392/386 |
| 2007/0240488 | A1 | 10/2007 | Kreuser et al. | 73/19.07 |
| 2007/0266949 | A1 | 11/2007 | Shenai-Khatkhate et al. | 427/248.1 |
| 2008/0014350 | A1 | 1/2008 | Carlson et al. | 118/715 |
| 2008/0038163 | A1 | 2/2008 | Boege et al. | 435/287.2 |
| 2008/0092816 | A1 | 4/2008 | Birtcher et al. | 118/726 |
| 2008/0143002 | A1 | 6/2008 | Steidl et al. | 261/122.1 |
| 2008/0191153 | A1 | 8/2008 | Marganski et al. | 134/22.1 |
| 2008/0268143 | A1 | 10/2008 | Vahlas et al. | 118/726 |
| 2009/0120364 | A1 | 5/2009 | Suarez et al. | 118/715 |
| 2009/0133632 | A1 | 5/2009 | Soininen | 261/104 |
| 2009/0159715 | A1 | 6/2009 | Lessig et al. | 236/1 |

FOREIGN PATENT DOCUMENTS

| | | |
|---|---|---|
| CN | 101310042 A | 11/2008 |
| DE | 3900069 | 7/1990 |
| DE | 202004010834 | 9/2004 |
| EP | 0288931 A2 | 11/1988 |
| EP | 0420596 A1 | 4/1991 |
| EP | 0482878 A2 | 4/1992 |
| EP | 0650048 A1 | 4/1995 |
| EP | 0696472 A1 | 2/1996 |
| EP | 0931861 A | 7/1999 |
| EP | 1006219 A1 | 6/2000 |
| EP | 1160355 | 10/2004 |
| GB | 2081450 A | 2/1982 |
| GB | 2212272 A | 7/1989 |
| GB | 2390905 A | 1/2004 |
| GB | 2432371 | 5/2007 |
| JP | 60070176 | 4/1985 |
| JP | 60-131973 | 7/1985 |
| JP | 02-48001 | 2/1990 |
| JP | 02-69389 | 3/1990 |
| JP | 03-31477 | 2/1991 |
| JP | 03-75295 | 3/1991 |
| JP | 07-278818 A | 10/1995 |
| JP | 8-279497 | 10/1996 |
| JP | 2000-128181 | 5/2000 |
| JP | 2002-83777 | 3/2002 |
| JP | 2003-273093 | 9/2003 |
| JP | 2007-278818 | 10/2007 |
| JP | 2009051607 | 3/2009 |
| JP | 2010032535 | 2/2010 |
| KR | 10200536951 A | 4/2005 |
| RU | 2045999 | 7/1992 |
| RU | 2274483 | 4/2006 |
| SU | 1126315 | 5/1983 |
| SU | 1669524 | 7/1989 |
| TW | 200401883 | 2/2004 |
| TW | 200719949 | 6/2007 |
| WO | WO 98/27247 | 6/1998 |
| WO | WO 00/07954 | 2/2000 |
| WO | WO 01/42539 | 6/2001 |
| WO | WO 02/07848 | 1/2002 |
| WO | WO 2004/007793 | 1/2004 |
| WO | WO 2004/008085 | 1/2004 |
| WO | WO 2005/066535 | 7/2005 |
| WO | WO 2005/113857 | 12/2005 |
| WO | WO 2005/118119 | 12/2005 |
| WO | WO 2006/104992 | 10/2006 |

| WO | WO 2007/010810 | 1/2007 |
| WO | WO 2007/121202 | 10/2007 |
| WO | WO 2010/021891 | 2/2010 |
| WO | WO 2011/053505 | 5/2011 |

OTHER PUBLICATIONS

Eisch (1962), "Organometallic Compounds of group III. I . The preparation of gallium and indium alkyls from organoaluminum compounds", *J. Am. Chem. Soc.*, 84(19):3605-3609.

Epichem Group e-news, Jun. 20, 2008 1 page.

Epichem group news, Teamwork Award, 2006, 12 pages.

Insight, SAFC Expansion in Far East, Apr. 2008, 7 pages.

International Search Report in PCT/GB00/02559, published WO 01/042539, dated Jun. 14, 2001.

International Preliminary Examination Report in PCT/GB00/02559, published WO 01/042539, dated Nov. 8, 2001.

International Search Report in PCT/GB01/00906, published WO 02/07848, dated Jan. 31, 2002.

International Preliminary Examination Report in PCT/GB01/00906, published WO 02/07848, dated Nov. 6, 2002.

International Search Report in PCT/GB03/02761, published WO 04/008085, dated Jan. 22, 2004.

International Preliminary Examination Report in PCT/GB03/02761, published WO 04/008085, dated Jun. 15, 2004.

International Search Report in PCT/US2009/053587, published WO/2010/021891, dated Feb. 25, 2010.

International Search Report in PCT/US2010/053557, published WO/2011/053505, dated May 5, 2011.

International Preliminary Report on Patentability in PCT/US2009/053587, published WO 10/021891, dated Feb. 22, 2011.

Mohl K-D, et al. (1998), "Mehrfache stationäre Betriebszustände bei der Herstellung des Kraftstoffethers TAME durch Reaktivrektifikation—Teil 1: Theoretische Analyse" ["Multiple stationary operating states in the production of the fuel ether TAME by reactive rectification—Part 1 : Theoretical analysis"], *Chemie Ingenieur Technik*, 70(5):524-527.

Smith L M et al., *Trimethylindium Transport Studies: The Effect of Different Bubbler Designs*, Journal of Crystal Growth. 272:(1-4) 37-41 (2004 ).

International Preliminary Report on Patentability for PCT/GB2006/003801 issued on Feb. 29, 2008.

International Search Report and Written Opinion for PCT/GB2006/003801 issued on Jan. 15, 2007.

* cited by examiner

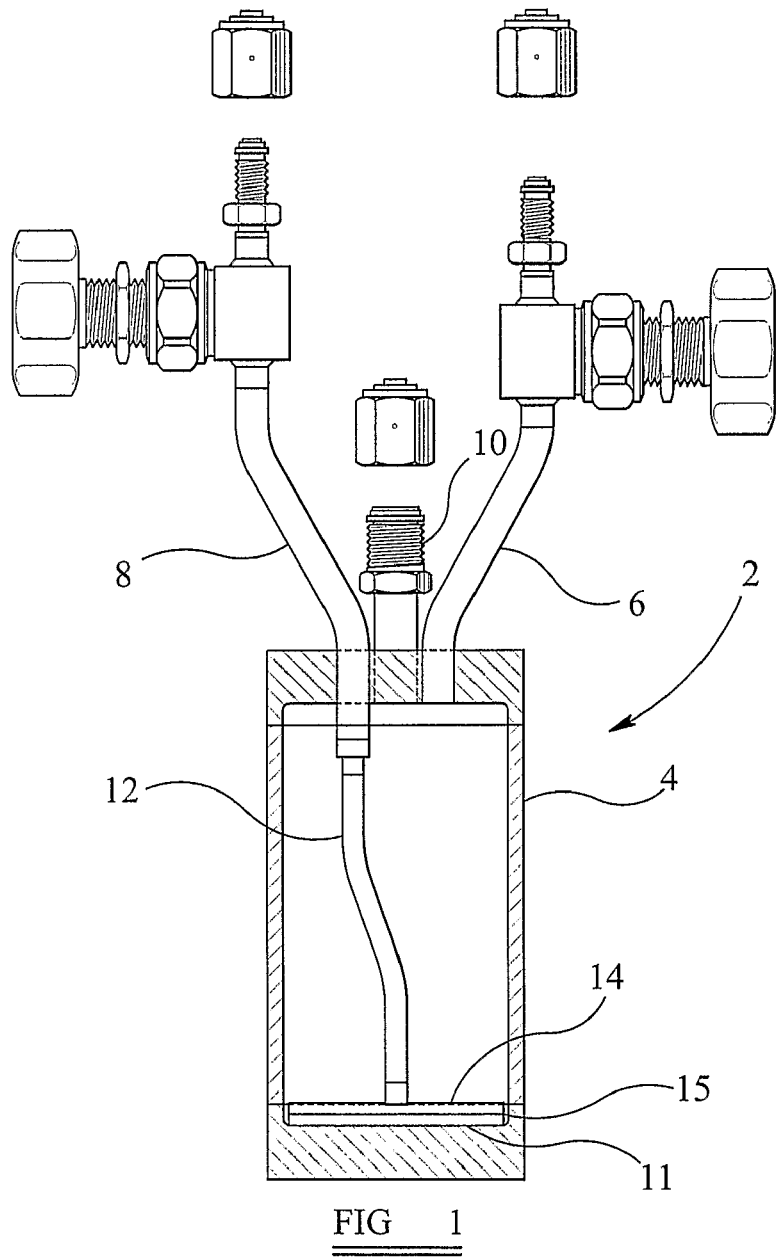
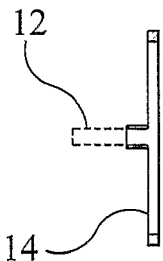
FIG 2a
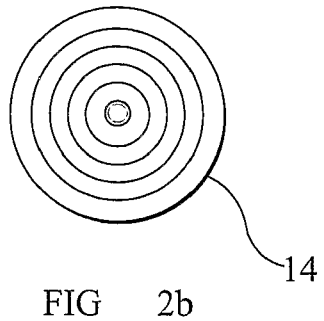
FIG 2b
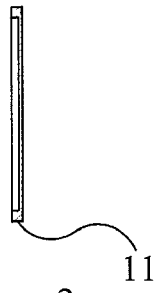
FIG 2c

BUBBLER FOR THE TRANSPORTATION OF SUBSTANCES BY A CARRIER GAS

This application is a national stage filing under 35 U.S.C. §371 of International Application No. PCT/GB2006/003801, filed Oct. 12, 2006 (published as WO 2007/057631 on May 24, 2007), which claims the benefit of and priority to United Kingdom Application No. GB 0523429.9, filed on Nov. 17, 2005. The entire disclosures of each of the above applications are incorporated herein by reference.

The present invention relates to an improved bubbler for the transportation of substances by a carrier gas and to a method of transporting a carrier gas saturated by a substance. In particular, the invention relates to an improved bubbler for the transportation of metalorganic precursors for use in chemical vapour deposition techniques.

It is common practice in the semiconductor industry for electronic devices to be produced by means of a Chemical Vapour Deposition (CVD) process. A liquid or solid precursor is supplied in a bubbler through which a carrier gas, such as hydrogen, may be bubbled via a dip pipe such that the gas becomes saturated with the precursor. The carrier gas/precursor vapour mixture is then passed at a controlled rate into an epitaxial reactor. Such systems are used in the production of both silicon and compound semiconductors. It is important that the concentration of the chemical in the vapour phase be extremely stable. However, channeling and non-uniform surfaces provided by the conventional single-use type of bubbler can lead to variable vapourisation of the product causing fluctuations in the gas phase concentration. Such fluctuations are adverse to the deposition process. This is particularly noticeable with solid precursors, such as trimethylindium.

In metalorganic vapour phase epitaxy systems (MOVPE), a steady, controllable flux of precursor into the reaction chamber is a key factor when fabricating highly complex device structures having ternary and quaternary layers. Historically, the simple bubbler design has been employed to perform this task with the carrier gas flow and source temperature control being able to provide a suitably stable system. However, increasing volume demands placed on MOVPE equipment have necessitated increased flows and larger bubblers. The simple single dip tube-type bubbler is no longer suitable to meet these requirements.

U.S. patent application Ser. No. 09/870,245 published 27 Jun. 2002 and European Patent Application Publication No. 1 160 355 (Shipley Company LLC) describes a bubbler that has a porous material, such as a fit contained within a conical section of the bubbler to retain the solid material within the bubbler and direct the flow of carrier gas through the material. The frits assist in providing uniform carrier gas flow through the solid material. However, the frits provide random passages for the flow of the carrier gas through the material. This may result in interference occurring which reduces the effectiveness of the frits.

It is an object of the present invention to provide an improved bubbler that allows for enhanced transfer of a substance by a carrier gas, particularly but not exclusively for the transfer of a metalorganic compound for use in a chemical vapour deposition process.

It is a further object of the present invention to provide an improved method for the transfer of a substance, such as a metalorganic compound, by a carrier gas for use in a chemical deposition process.

Accordingly, a first aspect of the present invention provides a bubbler comprising a sealed vessel containing a substance, the vessel having an inlet and an outlet for the delivery of a carrier gas into and out of the vessel, the inlet or outlet being connected to a conduit extending into the vessel, the vessel being provided with a member positioned between said inlet and said outlet, the member being provided with a plurality of apertures therein at predefined spaced apart intervals.

The vessel is generally in the form of an elongated cylinder. Preferably, the member is made from a non-porous material. More preferably, the member is formed from a metal, such as stainless steel. The member preferably extends transverse to the longitudinal direction of the vessel. The member is preferably circular with the perimeter of the member following the contours of internal sides of the vessel. The member is preferably substantially flat, for example being in the form of a disc. Preferably, the member extends across substantially the entire cross section of the vessel. It is preferable for the member to be provided in the lower part of the vessel.

The member preferably extends outwardly from the conduit. Preferably, the member extends from the free end of the conduit. For example, the member may be welded thereto.

Preferably, the apertured member comprises an upper and lower surface connected by sides. Preferably, the upper surface is provided with the plurality of apertures therein and extends outwardly from the end of the conduit. Alternatively, the end of the conduit may extend into the cavity formed between the upper and lower surface. The lower surface is preferably solid. In this manner, the carrier gas may pass through the apertures and be directed into the dip tube or vice versa. Preferably, the member is in the form of a truncated cylinder wherein the upper and lower surfaces are circular discs.

The apertures provided within the member are at predefined spaced apart intervals to ensure that the carrier gas is dispersed across substantially the entire cross-sectional area of the vessel and to assist in providing a uniform carrier gas flow through the substance contained in the vessel. The size and density of apertures provided in the member is important in providing optimum pick up and flow of the carrier gas mixture. The arrangement of apertures may be random or geometric, such as in the form of concentric circles, provided that an optimum density is maintained. However, more preferably, the arrangement of apertures is random.

The density of the apertures is preferably in the range of 5 to 25, more preferably 10 to 20 holes per square cm. The diameter of the holes is preferably less than 0.5 mm, more preferably 0.1 to 0.2 mm, especially 0.15 mm.

In a preferred embodiment of the present invention, the vessel comprises an inner and outer chamber, the inner chamber comprising the conduit. The member preferably extends transversely across the inner and outer chambers. More preferably, the chambers are cylindrical. It is preferable for the diameter of the inner chamber to be approximately one third the diameter of outer chamber.

The diameter of the inner chamber is preferably at least 20 mm, more preferably at least 25 mm. The diameter of the outer chamber is preferably at least 75 mm, more preferably at least 80 mm.

Preferably, the inlet is connected to the outer chamber and the outlet is connected to the inner chamber.

It is preferable to provide the substance that is to be carried in the carrier gas within both the inner and outer chambers. More preferably, the ratio of substance in the outer chamber to the inner chamber is in the range 5 to 7:1.

A preferred embodiment of the present invention provides a bubbler comprising a sealed vessel containing a substance, the vessel having an inlet and an outlet for the delivery of a carrier gas into and out of the vessel, the inlet being connected to an outer chamber extending into the vessel and the outlet being connected to an inner chamber within said outer chamber, said inner and outer chambers being in fluid communication, at least one of the chambers being provided with a member positioned between said inlet and said outlet, the member being provided with a plurality of apertures therein at predefined spaced apart intervals.

A second aspect of the present invention provides a method of transporting a substance to a reactor site, the method comprising introducing a carrier gas into a vessel containing a substance, passing the carrier gas through apertures provided at predefined spaced apart intervals in a member provided in the vessel, passing the gas through the substance and delivering the carrier gas mixture to a reactor site.

More preferably, the carrier gas is passed through an outer chamber containing the substance prior to passing the carrier gas through apertures provided in the member. More preferably still, the carrier gas is then passed through an inner chamber containing further substance prior to its delivery to a reactor site.

The present invention is particularly suitable for the delivery of liquid or solid metalorganic compounds to a reactor site, such as trimethylgallium, trimethylindium, trimethylaluminium, dimethylzinc and triethylgallium. It is particularly suitable for the delivery of solid precursors, such as trimethylindium or for any process where highly stable chemical vapour phase concentrations must be maintained. The carrier gas that picks up the substance may be any suitable permanent gas that does not react with the substance that it carries, such as hydrogen or nitrogen. The invention is effective for both forward or reverse flow of a carrier gas through a bubbler.

It is to be appreciated that the pressure, temperature and rate of flow of carrier gas through the equipment would be carefully selected and controlled by means well known to those skilled in the art.

For a better understanding of the present invention and to show more clearly how it may be carried into effect reference will now be made by way of example only to the following Examples which investigate the transportation of trimethylindium by a carrier gas using a bubbler according to a first and second embodiment of the present invention and with reference to the accompanying drawings in which:

FIG. 1 is a schematic drawing of a bubbler according to a first embodiment of the present invention;

FIG. 2a is a cross sectional view of the end of the dip-tube which receives the perforated disc to provide a bubbler according to one embodiment of the present invention plan;

FIGS. 2b and 2c are respectively a plan view and cross sectional view of a perforated disc for attachment to the dip tube shown in FIG. 2a;

Figure 3:
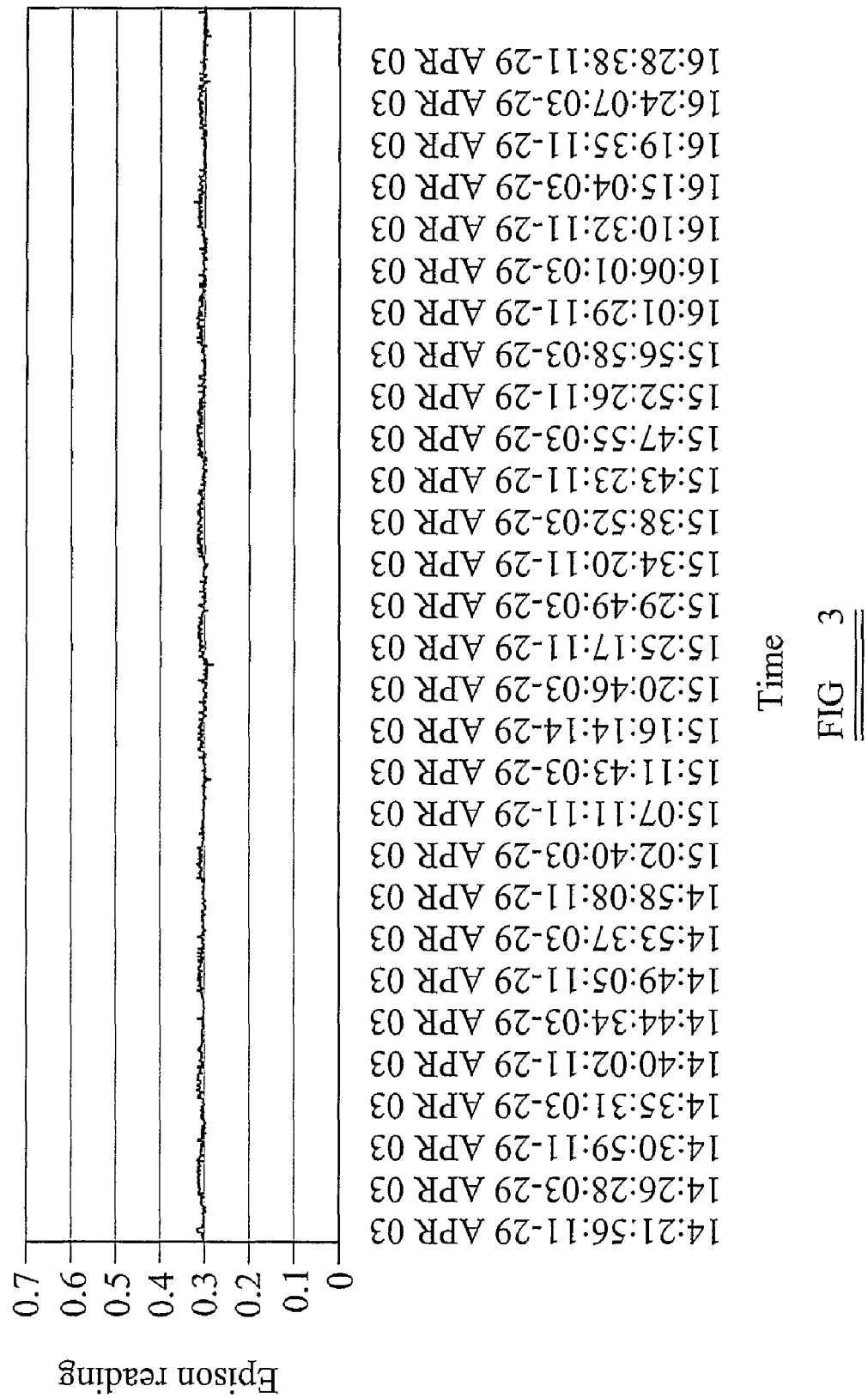
FIG. 3 is a plot of an Epison 135 reading versus time for the pick up of trimethylindium using a reverse flow perforated disc bubbler according to the present invention at a pressure of 1000 mbar, a flow rate of 1000 seem and a temperature of 17° C.
Figure 4:
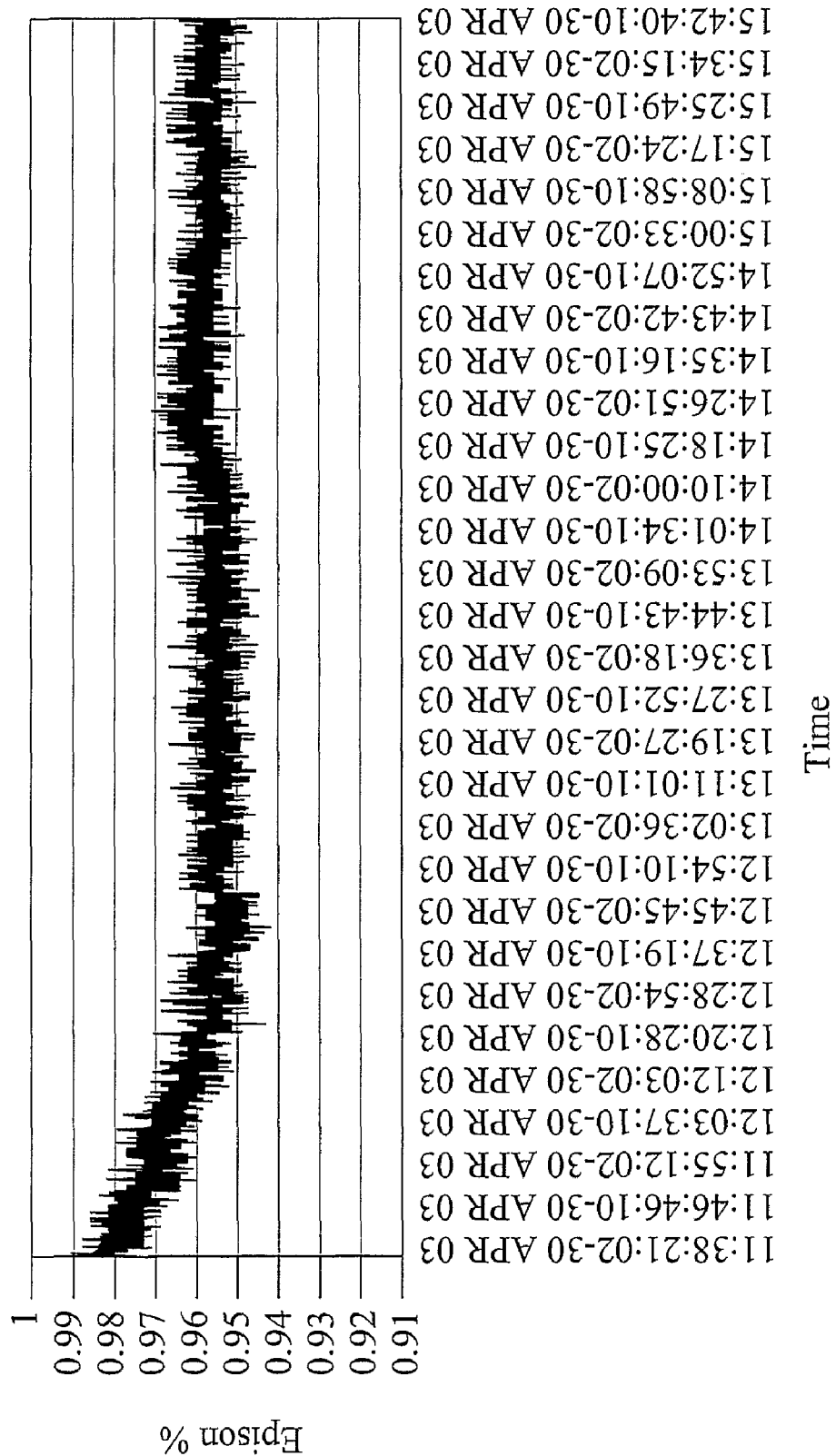
FIG. 4 is a plot of an Epison 136 Percentage reading versus time for the depletion of trimethylindium using a bubbler according to the present invention at a pressure of 250 Torr, a flow rate of 300 sccm and a temperature of 17° C.
Figure 5:
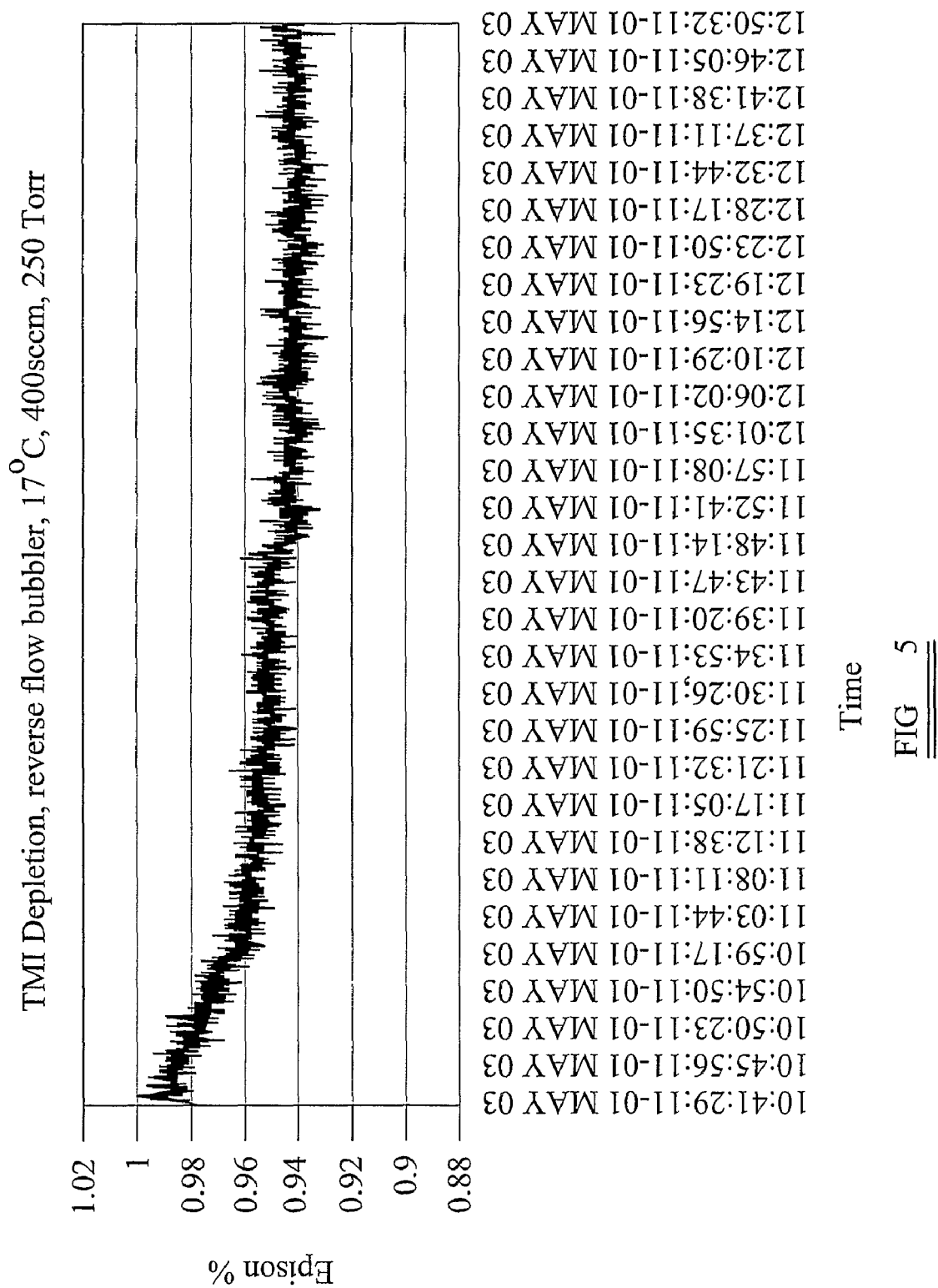
FIG. 5 is a plot of an Epison 136 Percentage versus time for the depletion of trimethylindium using a bubbler according to the present invention at a pressure of 250 Torr, a flow rate of 400 sccm and a temperature of 17° C.
Figure 6:
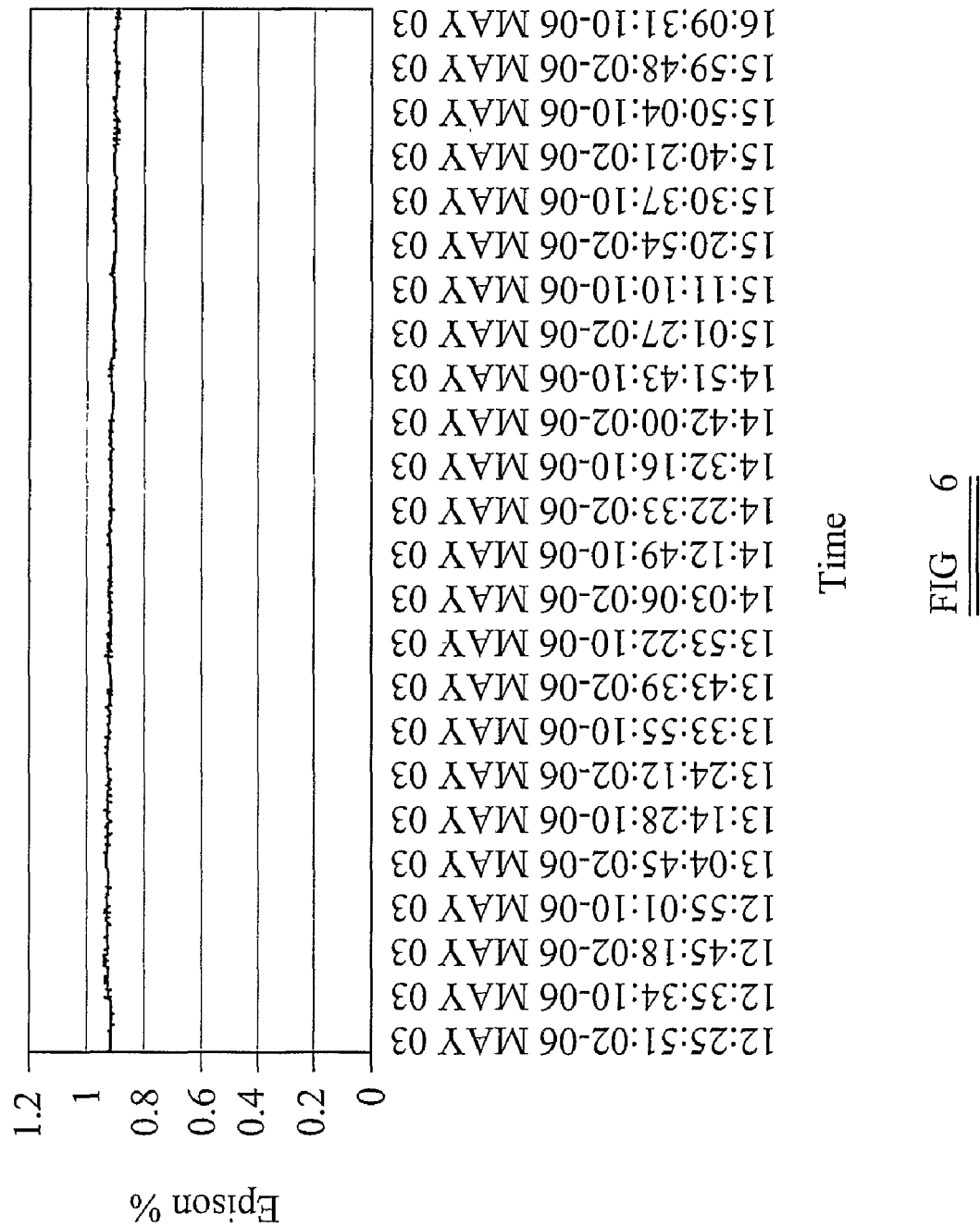
FIG. 6 is a plot of an Epison 138 Percentage reading versus time for the depletion of trimethylindium using a bubbler according to the present invention at a pressure of 250 Torr, a flow rate of 600 sccm and a temperature of 17° C.
Figure 7:
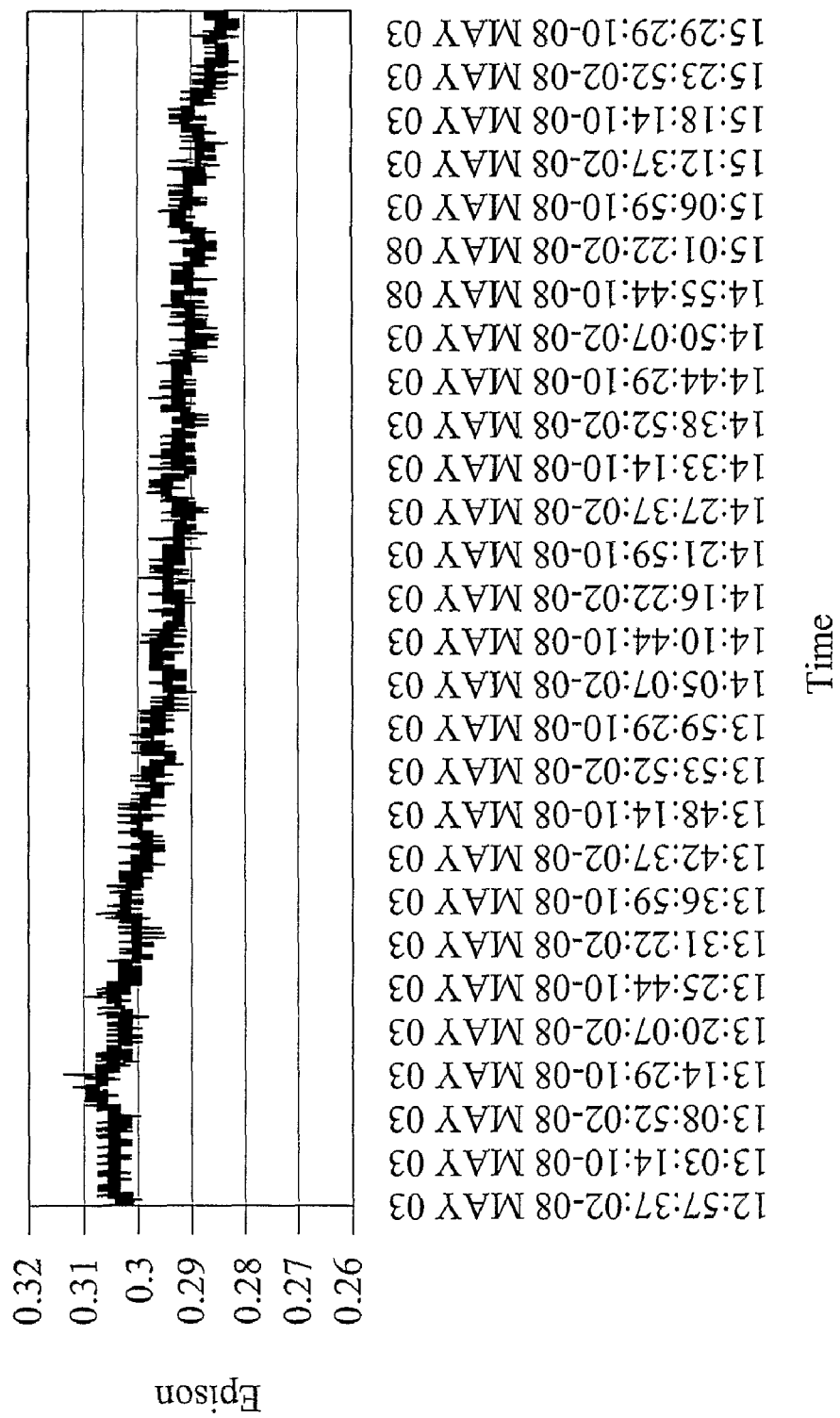
FIG. 7 is a plot of an Epison 140 reading versus time for the pick up trimethylindium using a bubbler according to the present invention at a pressure of 250 Torr, a flow rate of 700 sccm and a temperature of 17° C.
Figure 8:
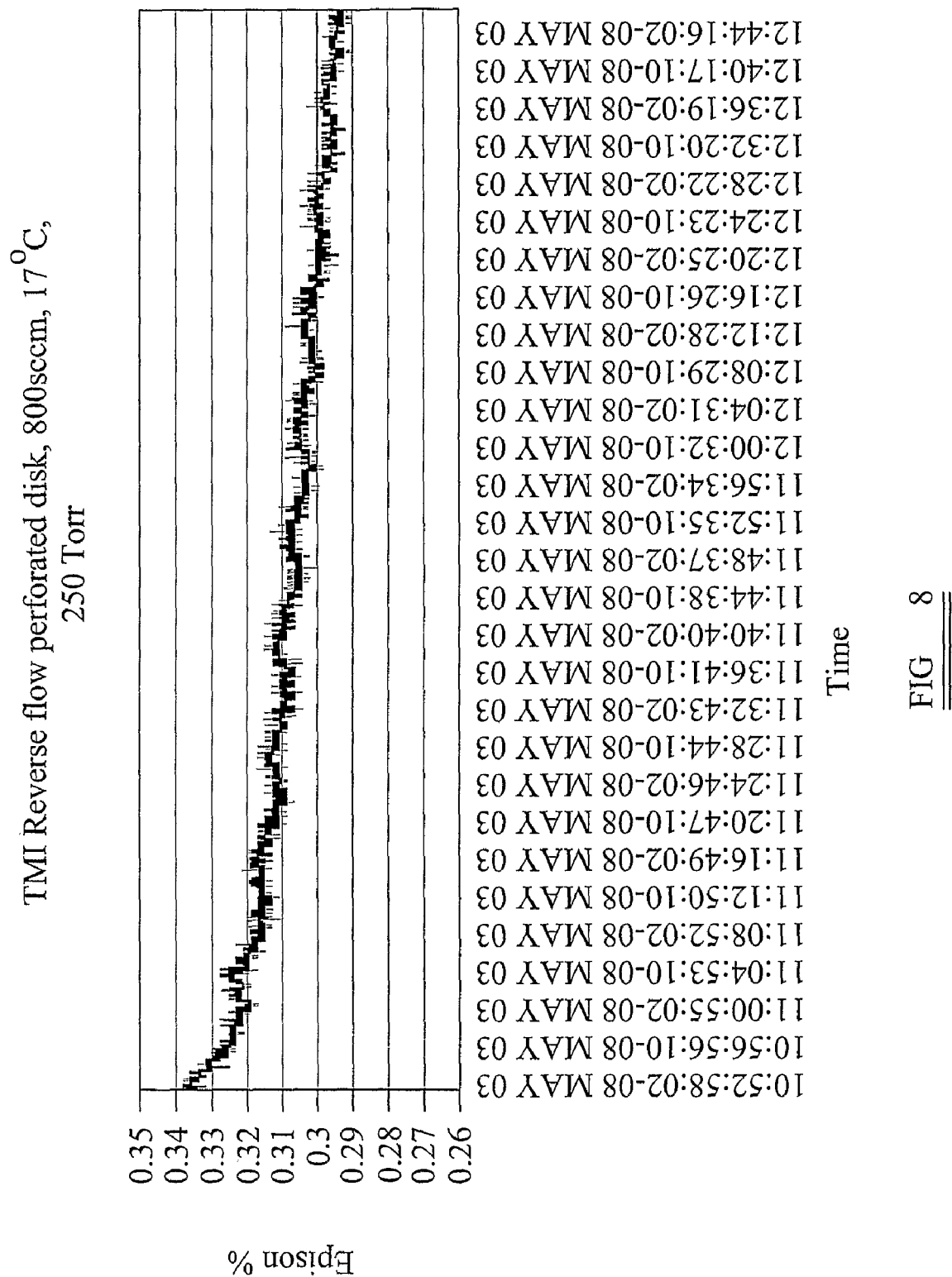
FIG. 8 is a plot of an Epison Percentage reading versus time for the depletion of trimethylindium using a bubbler of the present invention at a pressure of 250 Torr, a flow rate of 800 sccm and a temperature of 17° C.
Figure 9:
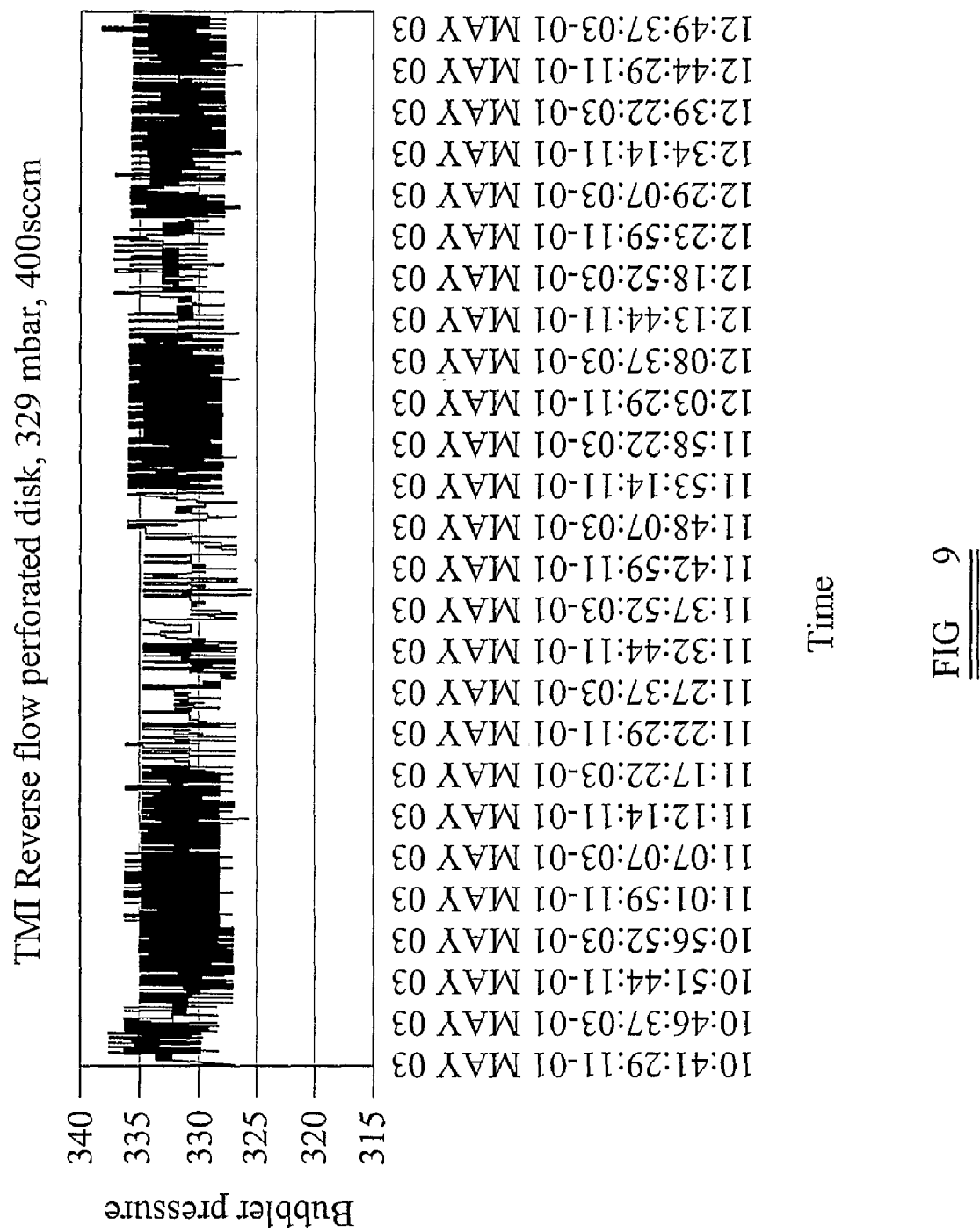
FIG. 9 is a plot of the bubbler pressure versus time for the pick up of trimethylindium using a bubbler according to the present invention at a pressure of 329 mbar and a flow rate of 400 sccm.
Figure 10:
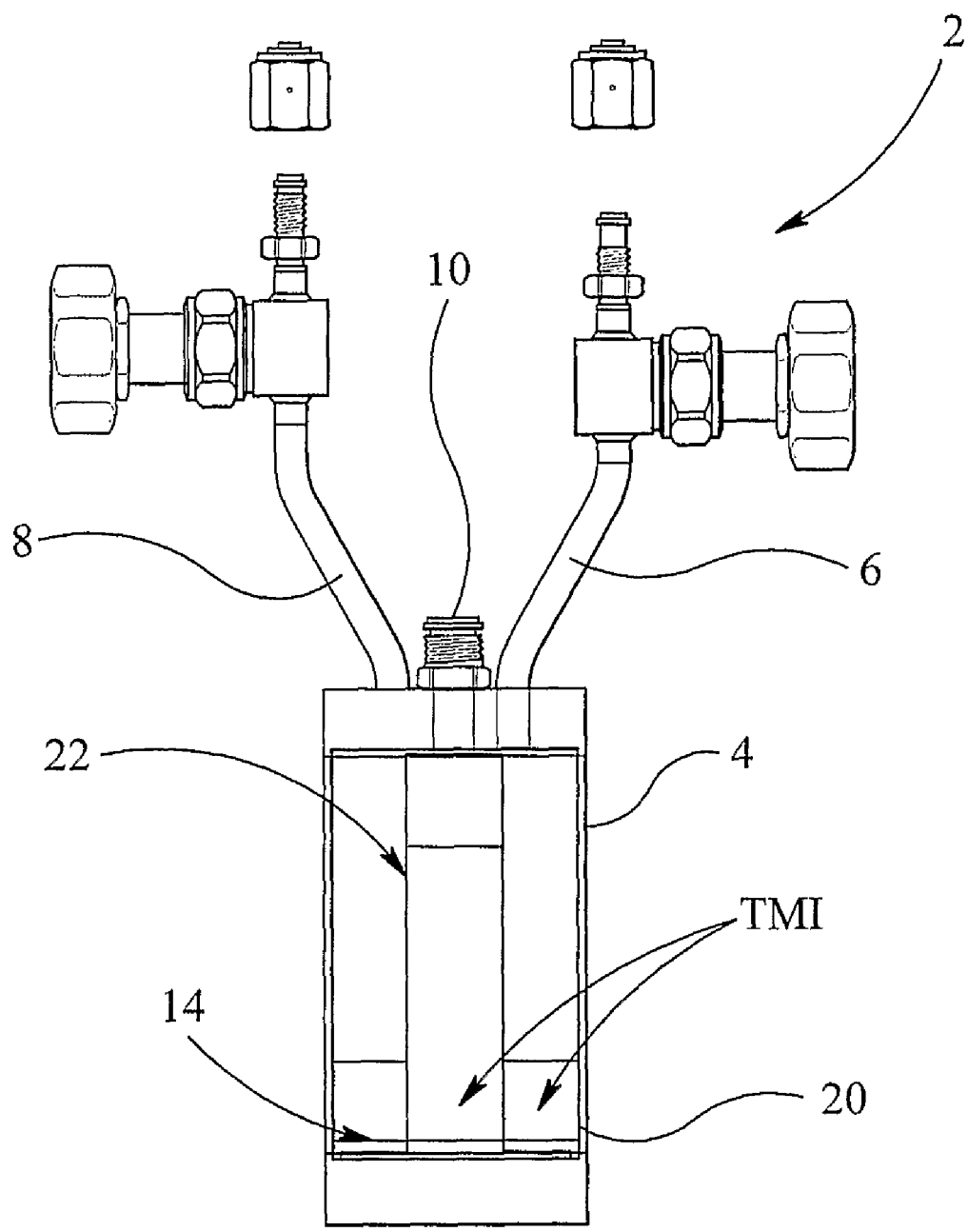
FIG. 10 is a schematic diagram of a bubbler according to a second embodiment of the present invention, illustrating the fill of solid precursor within the bubbler.
Figure 13:
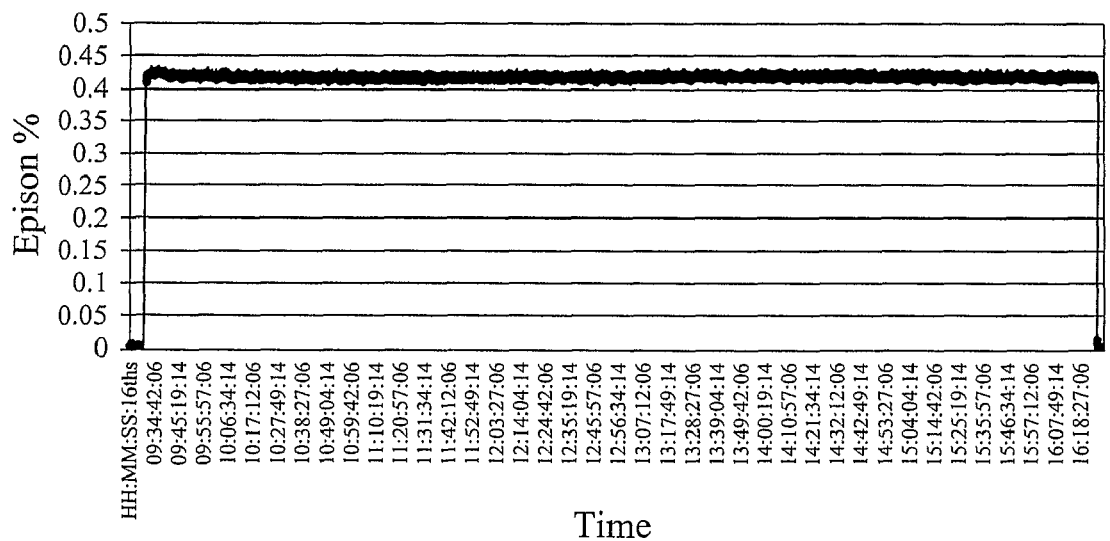
Figure 14:
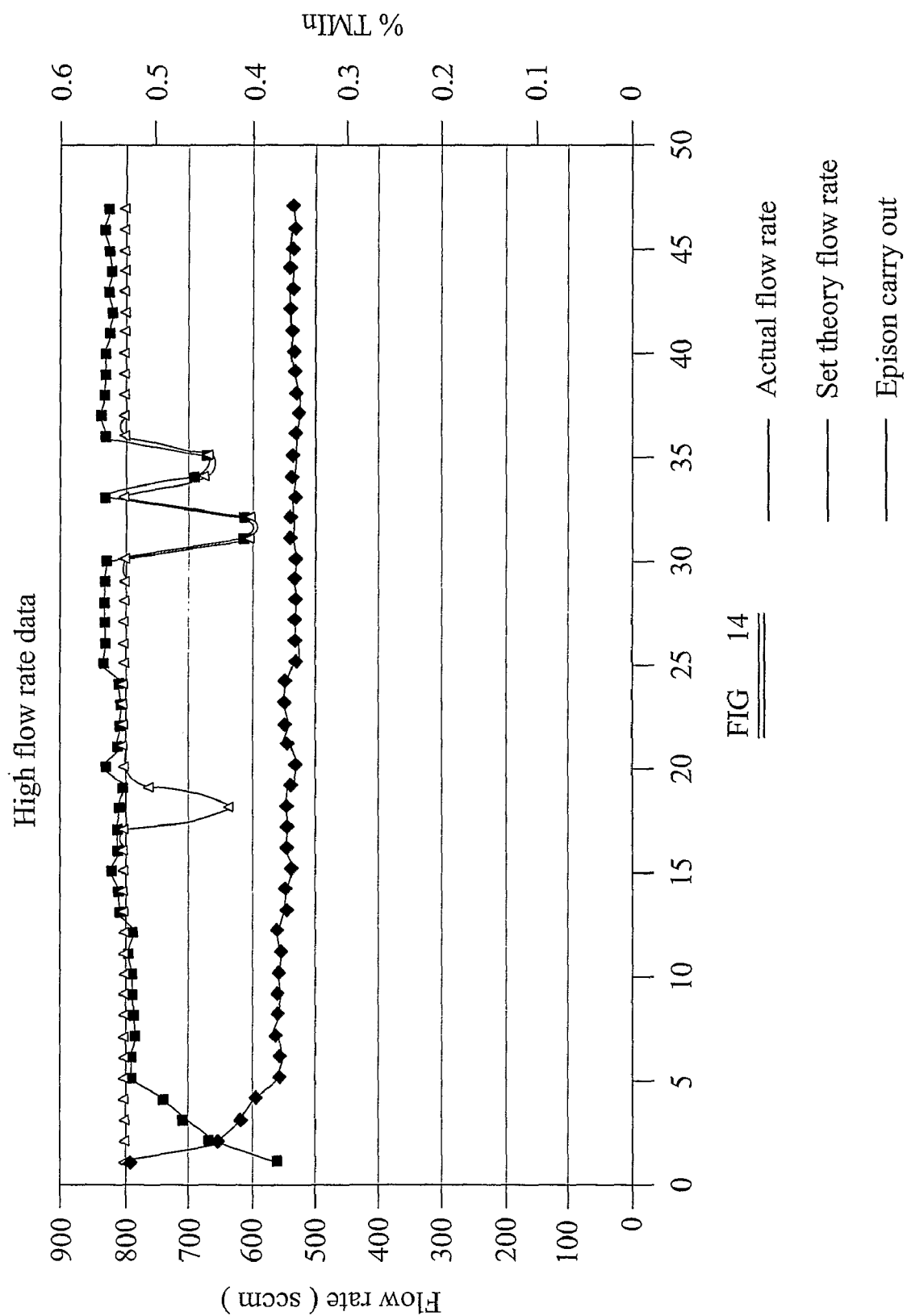

FIG. 13 is a plot of an Episom Percentage reading versus time for the depletion of trimethylindium using the bubbler shown in FIG. 10 at a flow rate of 800 sccm, a pressure of 250 Torr and a temperature of 25° C.; and FIG. 14 is a plot of flow rate (sccm) versus high brightness LED growth condition (medium flow medium pressure regime) of trimethylindium using the bubbler according to the second embodiment of the present invention.

FIGS. 1 to 2c of the accompanying drawings illustrate a bubbler according to one embodiment of the present invention. The bubbler is particularly but not exclusively suitable for the delivery of a metalorganic compound, such as trimethylindium, to a reactor site. The bubbler 2 has a closed chamber 4 having an inlet pipe 6, an outlet pipe 8 and a fill port 10. The outlet pipe is connected to a dip tube 12 that extends through substantially the length of the chamber. A perforated disc 14 is welded to the base of the dip tube, the disc extending across substantially the entire diameter of the chamber. A solid disc 11 is provided beneath the perforated disc as is connected thereto by sides 15. The disc is of stainless steel but any other suitable material may be used with the small holes being formed using laser drilling techniques. In the example shown, the disc is provided with a series of perforations in concentric circles (see FIGS. 2b and 2c). However, the pattern of holes through the disc is not limited to this arrangement.

Carrier gas, such as hydrogen, is introduced into the chamber 4 containing a metalorganic precursor, such as trimethylindium. The gas is directed through the holes in the perforated disc 12 and picks up the vapourised compound. The gas mixture is then able to pass up the dip tube 12 and exit the chamber through the outlet pipe 8.

The provision of a perforated disc across the chamber acts to disperse the carrier gas over the entire cross section of the bubbler thus more evenly contacting all areas of the metalorganic precursor contained therein. This improves the efficiency of transfer of the precursor into the vapour phase and saturation concentrations are achieved more readily across a wider operational timeframe resulting in the output flux from the bubbler remaining at a constant level.

The size and density of the holes through the disc are important to optimize the performance of the disc. A limit is reached where the provision of additional holes no longer improve performance of the bubbler, presumably due to some interference occurring between adjacent holes which disrupts optimum conditions. The arrangement of the holes may be random or geometric provided the optimum density of holes is maintained. For example, good results were achieved with approximately 700 holes having a diameter of 0.15 mm provided in a random manner throughout a 63 mm diameter circular plate. Alternatively, for a concentric arrangement, approximately 350 holes were provided on a 63 mm diameter circular plate.

It is to be appreciated that the bubbler would be provided with suitable conventional means for selecting and controlling the temperature, pressure and flow rate of the gas through the apparatus as would be well known to a person skilled in the art.

EXAMPLE 1

An investigation was carried out into the efficiency of transfer of solid trimethylindium in a carrier gas using the reverse flow bubbler shown in FIG. 1. The bubbler was tested under a variety of conditions and the conditions at which the bubbler gave a steady Epison reading over time were recorded. The data was collected via a Trendview recorder, which records the bubbler pressure, the pressure at the pressure controller and the Epison reading. Data for each flow rate was recorded for 2 hours without interruption. The error in the Epison readings was ±0.005 and the error in the pressure readings was ±3 mbar.

The reverse flow bubbler used had a 100% fill level of 300 g. 60 g of solid trimethylindium was added to the bubbler, resulting in the bubbler being 20% full, and the bubbler was connected to the Epison kit. The low fill level was used to represent a bubbler nearing the end of its lifetime which, using conventional bubblers, corresponds to a level wherein pick up rates are reduced. Thus, the fill level enabled effective saturation efficiencies of the bubbler to be investigated under difficult parameters. The temperature of the source was maintained at 17° C.

FIGS. 3 to 9 illustrate the pick up and depletion of trimethylindium in the carrier gas using a bubbler of the present invention at various pressures and flow rates. The graphs represent the output flux from the bubbler as measured by an ultrasonic system. This system reports a reading which can be directly related to the concentration of the metalorganic in the carrier gas. It is desirable to obtain a constant output concentration at a given flow rate, pressure and temperature. Such an output is indicated by a straight line on the graphs. When conditions change, the reading will vary and it is this fluctuation which causes problems. In the case of trimethylindium, the contact time and surface area available is key to obtaining a constant concentration of product in the vapour phase. The present invention assists in optimizing the carrier gas path through the product to obtain a homogenous contact throughout the bubbler life and maintain good efficiency of vapourisation as depletion of the contents of the bubbler occurs during use. In contrast, a conventional single dip leg arrangement leads to larger fluctuations in the reading and greater pick up drop off at the end.

As can be seen from FIGS. 3 to 9, with a fill level of 40-60 g, the reverse flow perforated disc bubbler worked well at 760 ton and as high as 1000 sccm flow rate. At 250 ton, the bubbler gave good results up to a flow rate of 600 sccm, before the Epison reading became unsteady at above 700 sccm. A stability of flow for flows as high as 1000 sccm at atmospheric pressure an as high as 500 sccm at reduced pressure is a marked improvement on standard dip tube results obtained using the same equipment.

It should be noted that for the above experiments no ideal pressure control was observed with fluctuations of over 5 mbar being experienced, adversely affecting the stability of the output. However, even with these no optimized parameters, the design of bubbler according to the present invention provided better results than is achieved with the single large hole entry provided by a conventional dip tube. Furthermore, in a number of the graphs a lead period is present which is believed to be related more to the pressure control than the performance of the perforated disc.

The Example shown uses the solid precursor trimethylindium but the bubbler of the present invention may also be used for the transport of liquid precursors used in any chemical vapour deposition or CVD-like applications where highly stable chemical vapour phase concentrations must be maintained. It is particularly relevant to high flow usage where carrier gas saturation is more difficult to achieve using standard bubbler designs. In the case of a liquid precursor, the small hole size of the perforations provided in the disc relative to a large single hole provided by a conventional dip tube produces small bubbler size that allows full gas saturation in a shallower liquid depth. This ensures that saturation is achieved throughout the lifetime of the bubbler at an improved efficiency, ensuring stable output fluxes. The small bubbles also result in the surface of the precursor within the chamber being disturbed less, leading to reduced pressure fluctuation and thus, a more stable output. In the case of a solid precursor, the small size of the holes provided through the disc relative to the large hole at the entry to a conventional single dip tube affords smaller area for channeling to nucleate, thereby improving the uniformity of the surface area contacted by the carrier gas. This improves the stability of the output gas phase concentration and improves the stability of the output over the lifetime of the bubbler. The provision of a perforated disc that extends substantially across the diameter of the chamber of the bubbler assists in dispersing the carrier gas across the whole of the chamber cross section which is beneficial to saturation efficiencies due to the gas more evenly contacting all areas of the substance contained within the chamber. With saturation concentrations being achieved more readily across a wider operational timeframe, the output flux from the bubbler remains at a constant level.

It is to be appreciated that a bubbler according to the present invention may be utilized for the flow of gas in a forward conventional direction passing down the dip tube and up through the metalorganic compound contained within the chamber or equally for a reverse flow configuration wherein gas passes down through the metalorganic compound and up the dip tube.

It is clear that the provision of a series of holes of a given density through which the carrier gas must pass improves the stability of flux output of the bubbler versus time and bubbler fill level. It also enhances the stability of flow output versus carrier flow rate and pressure of operation.

EXAMPLE 2

FIG. 10 of the accompanying drawings illustrates a bubbler according to a second embodiment of the present invention. For the sake of simplicity, identical features already discussed in relation to FIGS. 1 to 2c are given the same reference numerals. In addition to the presence of a perforated disc 14 as described above in relation to FIGS. 1 to 2c, the bubbler is provided with a dual chamber 20, 22 the inner chamber 22 comprising a dip leg of the bubbler being surrounded by an outer chamber 20.

The inner chamber 22 is of a wider diameter than is conventionally the case. In this respect, dip legs are normally around 0.25 inch (6.35 mm) whereas the inner chamber of the present invention has a diameter of around 1 inch (25.4 mm). The outer chamber has a diameter of around 3.388 inches (86 mm).

Additionally, precursor (eg TMI) is placed in the inner as well as the outer chamber, as illustrated in FIG. 10. The ratio of the precursor in the outer chamber to the inner chamber is around 5-7:1. The dip leg itself is approximately 75% full of precursor and the outer chamber is approximately 25% full. For example, for a 300 g fill, there will be up to 60 g of TMI in the central dip tube volume with the rest in the outer, second chamber.

Figure 11:
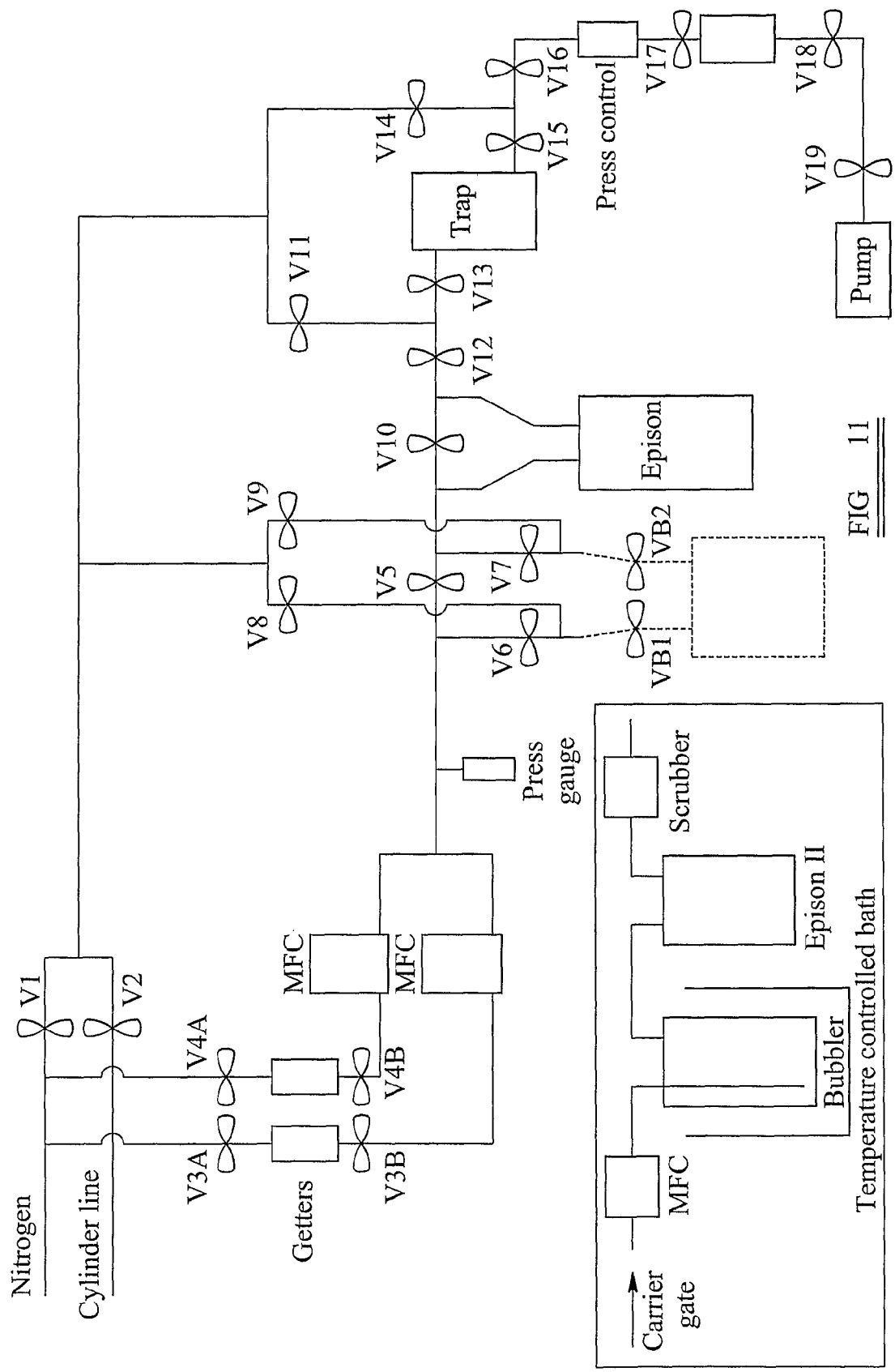
FIG. 11 is a schematic diagram of the experimental set-up for testing operation of the bubbler shown in FIG. 10.
Figure 12:
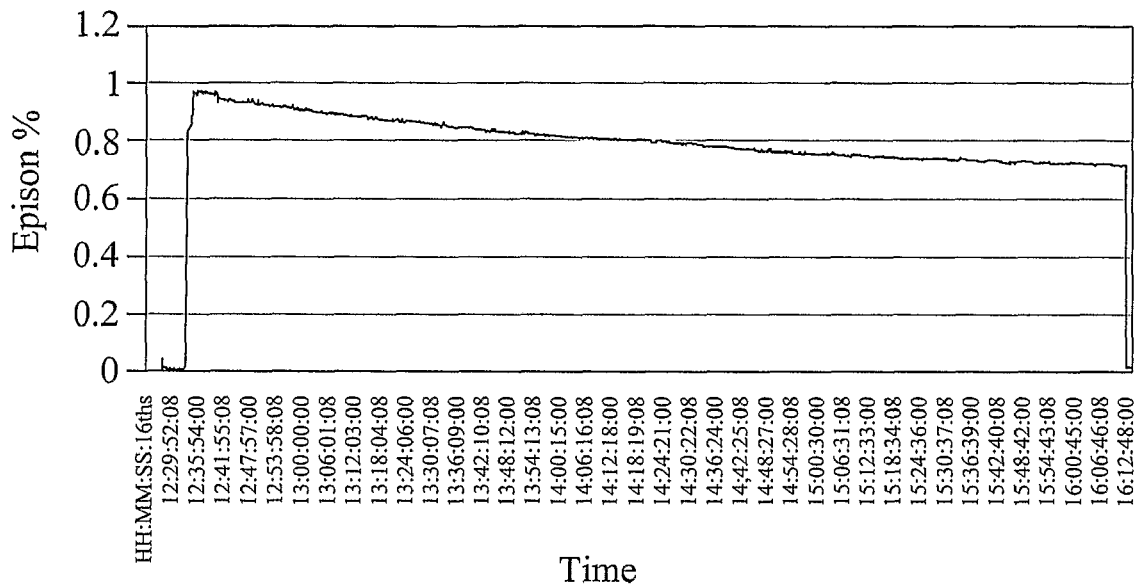
FIG. 12 is a plot of an Epison Percentage reading versus time for the depletion of trimethylindium using a conventional bubbler (EP 207 405 bubbler) in normal flow using TMI (335 g), at a flow rate of 920 sccm, a pressure of 250 Torr and a temperature of 25° C.

The pick up and stability of precursor using the bubbler shown in FIG. 10 was investigated using the experimental set up shown in FIG. 11. The design was shown to outperform conventional bubblers when tested using Epichem's equipment, Epison™, as illustrated by FIGS. 12 and 13 which show that highly stability of precursor output is achieved by the bubbler of the present invention even down to low fill levels, indicating high efficiency. FIG. 14 also demonstrates that there is excellent agreement between "theory flow" and "actual flow". Furthermore, the bubbler according to a second embodiment of the present invention is able to use a high percentage of the precursor prior to having to change the bubbler. For example, for an original fill level of 300 g, 85% of bubblers reached over 90% usage prior to change out and 35% of bubblers reached over 98% usage prior to change out.

The results demonstrate that the provision of a bubbler with a dual chamber, wider dip tube, perforated disc across the chambers and the provision of specific ratio of precursor in each section of the bubbler provides for improved pick up stability and performance. The increase in diameter of the dip tube slows down the gas velocity though this region to enhance contact residence time and allow improved gas saturation. Furthermore, the perforated disc at the outlet of the dip tube and chambers channels the saturated gas to all parts of the lower section of the bubbler interior to where a top-up reservoir of precursor resides such that the exhaust concentration is maintained at a stable level throughout the source usage time.

The bubbler is suitable for solid source delivery under high and low flow conditions and may be used for reverse flow of carrier gas.

What is claimed is:

1. A bubbler comprising a sealable vessel capable of containing a substance, the vessel having
   a wall with an internal surface,
   an inlet and an outlet for delivery of a carrier gas into and out of the vessel,
   a conduit having a base, and wherein the inlet or outlet is connected to the conduit,
   a member attached to the conduit and positioned between said inlet and said outlet, the member having a perimeter and a plurality of apertures at predefined spaced apart intervals and distributed therein in a range of about 5 to about 25 apertures per square cm, and the member having an upper surface and a lower surface connected by at least one side to thereby define a cavity,
   wherein the perimeter of the member is in contact with the internal surface of the wall of the vessel around perimeter of the member, and wherein the lower surface of the member is in contact with a bottom portion of the vessel.

2. The bubbler of claim 1, wherein the vessel is in the form of an elongated cylinder.

3. The bubbler of claim 1, wherein the member is made from a non-porous material.

4. The bubbler of claim 3, wherein the member is made of metal.

5. The bubbler of claim 4, wherein the member is made of stainless steel.

6. The bubbler of claim 1, wherein the member extends transverse to the longitudinal axis of the vessel.

7. The bubbler of claim 1, wherein the member is substantially flat.

8. The bubbler of claim 1, wherein the member extends outwardly from the conduit.

9. The bubbler of claim 8, wherein the member extends from the base of the conduit.

10. The bubbler of claim 8, wherein the member is welded to the conduit.

11. The bubbler of claim 1, wherein the apertures are arranged in a random or irregular pattern.

12. The bubbler of claim 1, wherein the apertures are arranged in a geometric or regular pattern.

13. The bubbler of claim 12, wherein the apertures are arranged in a series of concentric circles.

14. The bubbler of claim 1, wherein the member has a plurality of apertures distributed therein in a range of about 10 to about 20 apertures per square cm.

15. The bubbler of claim 1, wherein each aperture has a diameter of less than about 0.5 mm.

16. The bubbler of claim 15, wherein each aperture has a diameter of about 0.1 to about 0.2 mm.

17. The bubbler of claim 1, wherein the vessel comprises an inner and outer chamber, the inner chamber comprising the conduit.

18. The bubbler of claim 17, wherein the member extends transversely across the inner and outer chambers.

19. The bubbler of claim 17, wherein the inner and outer chambers are cylindrical with the diameter of the inner chamber being approximately one third the diameter of the outer chamber.

20. The bubbler of claim 19, wherein the diameter of the inner chamber is at least about 20 mm.

21. The bubbler of claim 19, wherein the diameter of the outer chamber is at least about 75 mm.

22. The bubbler of claim 17, wherein the inlet is connected to the outer chamber and the outlet is connected to the inner chamber.

23. The bubbler of claim 17, wherein the inner chamber and the outer chamber are both configured to hold at least part of the substance, and wherein the substance is to be carried in the carrier gas.

24. The bubbler of claim 23, wherein the inner chamber and the outer chamber are both configured to hold at least part of the substance so that a ratio of substance in the outer chamber to the inner chamber would be in the range 5 to 7:1.

25. The bubbler of claim 1, wherein the conduit extends into the vessel.

26. The bubbler of claim 1, wherein the bubbler is operable with a forward flow of carrier gas through the bubbler from the inlet to the outlet and with a reverse flow of carrier gas through the bubbler from the outlet to the inlet.

27. The bubbler of claim 1, wherein the plurality of apertures are located in the upper surface of the member.

28. A bubbler comprising a sealable vessel capable of containing a substance, the vessel having an inlet and an outlet for the delivery of a carrier gas into and out of the vessel, the inlet being connected to one of an outer chamber in the vessel and an inner chamber within said outer chamber, the outlet being connected to the other one of the outer chamber and the inner chamber, said inner and outer chambers being in fluid communication, the vessel also having a member positioned between said inlet and said outlet, the member having a plurality of apertures therein, the member having an upper surface and a lower surface connected by at least one side to thereby define a cavity at least partly within the member, the member being in contact with an interior surface of the outer chamber around a perimeter of the member, and the member being in contact with a bottom portion of the outer chamber along the lower surface of the member.

29. The bubbler of claim 28, wherein the inlet is connected to the outer chamber.

30. The bubbler of claim 28, wherein the plurality of apertures are located in the upper surface of the member.

31. The bubbler of claim 28, wherein the apertures are distributed in the member in a range of about 5 and about 25 apertures per square centimeter, and wherein a diameter of each aperture is less than about 0.5 millimeters.

32. A bubbler for transporting a substance by a carrier gas, the bubbler comprising a sealable vessel capable of containing the substance, the sealable vessel comprising:
an outer chamber having a wall with an internal surface;
an inner chamber disposed at least partly within the outer chamber, the inner chamber and the outer chamber being in fluid communication with each other;
an inlet for transporting the carrier gas to the sealable vessel;
an outlet for transporting the substance and the carrier gas from the sealable vessel;
a perforated disc having a perimeter and the perforated disc oriented generally transverse to a longitudinal axis of the vessel such that the perimeter of the perforated disc is in contact with the inner surface of the wall of the outer chamber around the perimeter of the perforated disc;
the perforated disc having a plurality of apertures at predefined spaced apart intervals and distributed therein in a range of about 5 and about 25 apertures per square centimeter, with a diameter of each aperture being less than about 0.5 millimeters;
wherein the perforated disc is capable of dispersing the carrier gas in the bubbler;
a substantially flat, solid disc connected to the perforated disc by sides thereby defining a cavity, the solid disc being in contact with a bottom portion of the outer chamber.

33. The bubbler of claim 32, wherein the bubbler is capable of transporting a metalorganic compound.

34. The bubbler of claim 32, wherein the inner chamber and the outer chamber of the sealable vessel are substantially concentric with each other about a longitudinal axis.

35. The bubbler of claim 32, wherein the perforated disc is substantially flat and circular in shape.

* * * * *